(12) United States Patent
Frokjaer

(10) Patent No.: US 8,052,383 B2
(45) Date of Patent: Nov. 8, 2011

(54) WIND TURBINE, A METHOD FOR CONTROLLING THE TEMPERATURE OF FLUID FLOWING IN A FIRST TEMPERATURE CONTROL SYSTEM OF A WIND TURBINE AND USE THEREOF

(75) Inventor: Poul Spaerhage Frokjaer, Gistrup (DK)

(73) Assignee: Vestas Wind Systems A/S, Randers SV (DK)

( * ) Notice: Subject to any disclaimer, the term of this patent is extended or adjusted under 35 U.S.C. 154(b) by 0 days.

(21) Appl. No.: 12/580,966

(22) Filed: Oct. 16, 2009

(65) Prior Publication Data

US 2010/0034653 A1 Feb. 11, 2010

Related U.S. Application Data

(63) Continuation of application No. PCT/DK2008/000152, filed on Apr. 24, 2008.

(30) Foreign Application Priority Data

Apr. 30, 2007 (DK) .................. 2007 00650

(51) Int. Cl.
*F03D 11/00* (2006.01)
(52) U.S. Cl. ....................................... 415/178
(58) Field of Classification Search ............ 415/178
See application file for complete search history.

(56) References Cited

U.S. PATENT DOCUMENTS

| 4,368,692 A * | 1/1983 | Kita .................. 122/26 |
| 5,275,231 A | 1/1994 | Kuze |
| 6,520,737 B1 * | 2/2003 | Fischer et al. ............. 415/4.3 |
| 7,111,668 B2 * | 9/2006 | Rurup .................. 165/134.1 |
| 7,168,251 B1 | 1/2007 | Janssen |
| 7,809,477 B2 | 10/2010 | Nitzpon et al. |
| 7,834,476 B2 | 11/2010 | Nitzpon et al. |
| 2005/0006905 A1 * | 1/2005 | Rurup .................. 290/55 |
| 2005/0167989 A1 | 8/2005 | Kruger-Gotzmann et al. |
| 2006/0115363 A1 * | 6/2006 | Schellstede .......... 416/244 R |

FOREIGN PATENT DOCUMENTS

| DE | 3714859 A1 | 11/1988 |
| DE | 19932394 A1 | 1/2001 |
| DE | 10016913 A1 | 10/2001 |
| WO | 2007051464 A1 | 5/2007 |

OTHER PUBLICATIONS

Danish Search Report; PA 2007 00650; Nov. 14, 2007; 1 page.
International Search Report; PCT/DK2008/000152; Jan. 19, 2009; 3 pages.
Udo Steinhauser; Written Opinion of the International Search Authority issued in priority International Application No. PCT/DK2008/000152; Jan. 26, 2009; 7 pages; European Patent Office.
Udo Steinhauser; International Preliminary Report on Patentability issued in priority International Application No. PCT/DK2008/000152; Nov. 3, 2009; 8 pages; The International Bureau of WIPO.

* cited by examiner

*Primary Examiner* — Richard Edgar
(74) *Attorney, Agent, or Firm* — Wood, Herron & Evans, L.L.P.

(57) ABSTRACT

A wind turbine includes a first temperature control system including fluid transporting heat to or from one or more components of the wind turbine. The wind turbine further includes a mechanism for exchanging heat between the first temperature control system and at least one further temperature control system of the wind turbine, wherein a temperature controlled mechanism enables the heat exchange between the first temperature control system and the at least one further temperature control system. A method for controlling or regulating the temperature of fluid flowing in a first temperature control system of a wind turbine and a use hereof is also contemplated.

19 Claims, 8 Drawing Sheets

WIND TURBINE, A METHOD FOR CONTROLLING THE TEMPERATURE OF FLUID FLOWING IN A FIRST TEMPERATURE CONTROL SYSTEM OF A WIND TURBINE AND USE THEREOF

CROSS-REFERENCE TO RELATED APPLICATIONS

The present application is a continuation of pending International patent application PCT/DK2008/000152 filed on Apr. 24, 2008 which designates the United States and claims priority from Danish patent application PA 2007 00650 filed on Apr. 30, 2007, the content of which is incorporated herein by reference.

FIELD OF THE INVENTION

The invention relates to a wind turbine, a method for controlling the temperature of fluid flowing in a first temperature control system of a wind turbine and use hereof.

BACKGROUND OF THE INVENTION

A wind turbine known in the art comprises a wind turbine tower and a wind turbine nacelle positioned on top of the tower. A wind turbine rotor with a number of wind turbine blades is connected to the nacelle through a low speed shaft, as illustrated on FIG. 1.

Large modern wind turbines typically comprise more than one temperature control system for controlling the temperature of different wind turbine components such as gearbox, generator or inverter.

A temperature control system will in most cases be the equivalent of a cooling system, in that the wind turbine components typically are producing heat during normal operation of the wind turbine, which needs to be removed to ensure the life and the efficiency of the component. But under some circumstances the temperature control system could also be used to heat up the component e.g. during start-up, in very cold environments or other.

Most temperature control systems comprise a fluid in the form of a refrigerant or coolant with advantageous qualities regarding transporting heat but sometimes this fluid has to fulfil other purposes than just transporting heat. E.g. in the gearbox of the wind turbine large amounts of oil are circulating to ensure lubrication of different parts of the gearbox. An operating gearbox produce heat and this heat are typically removed from the gearbox by means of the circulating oil which e.g. transports the heat to a radiator that gives off the heat to the surroundings.

But the lower the surrounding temperature is, the colder the oil becomes during its flow through the radiator, and the colder oil is, the higher its viscosity becomes hereby increasing the risk of the oil clogging the radiator or other part of the system.

An object of the invention is to provide for an advantageous technique for ensuring that the temperature of fluid circulating in a temperature control system in a wind turbine is controlled more advantageously.

SUMMARY OF THE INVENTION

The invention provides for a wind turbine comprising a first temperature control system including fluid transporting heat to or from one or more components of said wind turbine. The wind turbine further comprises means for exchanging heat between the first temperature control system and at least one further temperature control system of the wind turbine, wherein temperature controlled means enables the heat exchange between the first temperature control system and the at least one further temperature control system.

If the fluid in the first temperature control system is cooled too much, the viscosity or other characteristics of the fluid can change to a point where the fluids ability to transport heat in the temperature control system is reduced. It is therefore advantageous to enable that the fluid may exchange heat with another temperature control system when certain temperature conditions are present.

It should be emphasised that the term "temperature control system" is to be understood as a system capable of controlling the temperature of one or more components in or at the wind turbine. Characteristic features of such a system are that the system comprises a wind turbine component, a heat sink and a cooling medium for transporting heat between the component and the heat sink. The component can be a heat generating source and/or a heat absorbing source and the heat sink can give off and/or absorb heat.

In an aspect of the invention, said temperature controlled means is at least one valve, in that a valve is a simple and effective device for controlling the passage of a fluid.

In an aspect of the invention, said valve is a mechanical radiator valve.

As opposed to servo valves, solenoid valves or other types of valves operated by means of electrical actuator means e.g. comprising motors, the mechanical radiator valve is very simple, cost-efficient and do not need a supply of electricity of be operated. A mechanical radiator valve can be operated by a expanding and contracting gas, spring or other which in a simple and purely mechanical way provides the valve with the force needed to change the status (how open/how closed) of the valve in response to a change in temperature.

In an aspect of the invention, said fluid is oil.

Oil is used in several wind turbine components for its lubricating and/or electrically isolating qualities and with these components the oil can be used to transport heat to or from the component in a temperature control system. But since the viscosity of oil is highly dependent on the oils temperature it is particularly advantageous to create heat interaction between the first temperature control system comprising oil as the cooling medium and at least one separate and further temperature control systems in the wind turbine.

In an aspect of the invention, said fluid can transport heat between said one or more components and at least one heat sink of said first temperature control system for giving off or absorbing said heat.

Making the fluid transport heat between a component and a heat sink is advantageous in that it hereby in a simple and cost-efficient way is possible to remove any excess heat from the component or supply any needed heat to it.

In an aspect of the invention, said heat sink is a radiator.

A wind turbine usually comprises many components in a relatively small space. A radiator is very efficient at giving off large amounts of heat in a relatively small space and is therefore particularly suited for use in a wind turbine.

In an aspect of the invention, said heat sink comprises means for giving off said heat to or absorbing said heat from the surroundings of said wind turbine.

Since wind turbines usually need more cooling the more the wind blows and since the cooling capacity at least to some degree increases with the wind speed it is advantageous to heat exchange with the surroundings.

In an aspect of the invention, said temperature controlling said temperature controlled means is the temperature of the surroundings of said wind turbine.

The temperature of the surroundings is a direct indicator of the condition of the fluid in the first temperature control system, and it is therefore advantageous to control the heat exchanging between the systems on the basis of the surrounding temperature.

In an aspect of the invention, said temperature controlling said temperature controlled means is the temperature of the cooling medium of at least one further temperature control system.

The temperature of the cooling medium of the further temperature control system is a direct indicator of the excess cooling capacity of the further temperature control system and it is therefore advantageous to control the heat exchanging between the systems on the basis of the temperature of the cooling medium in the further temperature control system.

In an aspect of the invention, said at least one further temperature control system is a temperature control system of an electrical system of said wind turbine.

Since wind turbines produce large amounts of power the capacity of the temperature control systems for controlling the temperature in the electrical systems is very big. At lower temperatures the excess capacity of these systems is correspondingly big and it is therefore advantageous to use such a system for heat exchanging with the first temperature control system.

In an aspect of the invention, said electrical system is a generator of said wind turbine.

The temperature control system of the generator has a very large over-capacity at low temperatures and it is therefore advantageous to use the temperature control system of the generator for heat exchanging with the first temperature control system.

In an aspect of the invention, said one or more components are one or more gearboxes of said wind turbine.

An operating wind turbine gearbox produced much heat and since this heat traditionally is removed by cooling the oil flowing through the gearbox for lubricating purposes, it is particularly advantageous if the component connected with the first temperature control system is a generator.

In an aspect of the invention, said at least one first temperature control system is a system for controlling the temperature of a hydraulic system of a wind turbine.

To ensure the operation of the wind turbine it is important that the hydraulic system works flawlessly and reliably and it is therefore advantageous to enable heat exchanging between the hydraulic system and at least one further temperature control system.

In an aspect of the invention, said fluid circulates in said first temperature control system.

It is very difficult or impossible to establish an open temperature control system in a wind turbine e.g. due to the often remote location and it is therefore advantageous to make the cooling medium in the first temperature control system circulate.

In an aspect of the invention, said at least one further temperature control system comprises a circulating cooling medium.

Likewise it is advantageous to make the cooling medium in the further temperature control system circulate.

In an aspect of the invention, said temperature controlled means enables said heat exchange between said first temperature control system and said at least one further temperature control system by enabling a flow of said fluid through a dedicated heat exchanger which comprises means which enables that said fluid exchanges heat with a cooling medium of said at least one further temperature control system.

By enabling the heat exchange between the systems by means of a dedicated heat exchanger the heat exchange becomes more predictable and reliably.

The invention further provides for a method for controlling or regulating the temperature of fluid flowing in a first temperature control system of a wind turbine. The method comprises the steps of detecting a temperature of the wind turbine and controlling a valve on the basis of the temperature, wherein the valve can enable the fluid to heat exchange with at least one further temperature control system of the wind turbine.

By enabling heat exchange across different temperature control system of the wind turbine it is possible to better utilize the capacity of the different systems and by making this exchange temperature dependent the risk of overloading a system is reduced.

In an aspect of the invention, said temperature is the ambient temperature of said wind turbine.

In an aspect of the invention, said temperature is the temperature of a cooling medium of said at least one further temperature control system.

In an aspect of the invention, said fluid is oil.

Even further the invention provides for use of a method as described above for controlling the temperature of fluid flowing in a temperature control system of a wind turbine, wherein said wind turbine is a variable speed pitch wind turbine.

Because variable speed pitch wind turbines operate at different rotation speeds it is particularly important that the efficiency and capacity of the temperature control systems are flexible.

BRIEF DESCRIPTION OF THE DRAWINGS

The invention will be described in the following with reference to the figures in which FIG. 1. illustrates a large modern wind turbine as seen from the front.

DETAILED DESCRIPTION OF THE INVENTION

Figure 1:
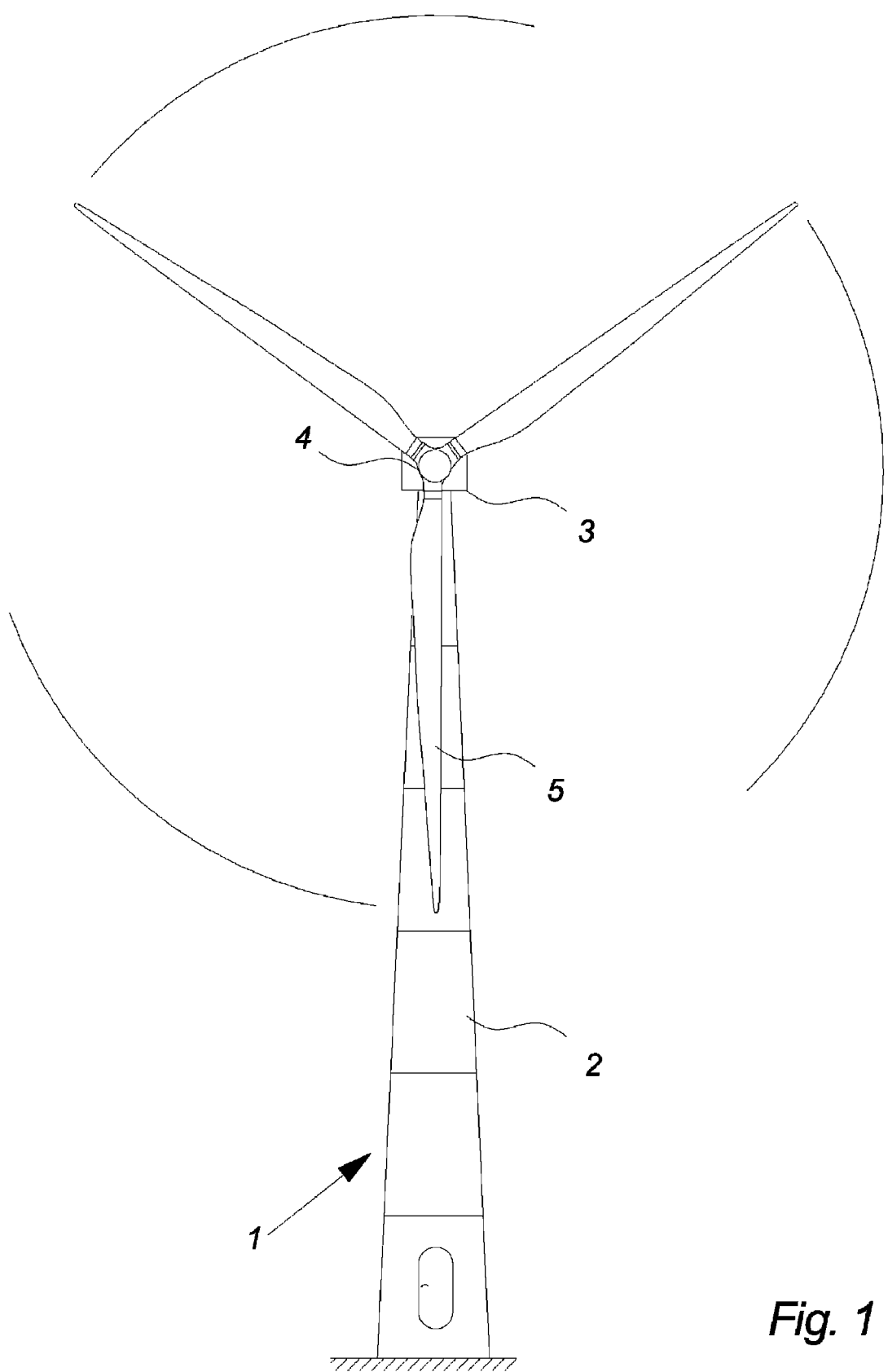

FIG. 1 illustrates a wind turbine 1, comprising a tower 2 and a wind turbine nacelle 3 positioned on top of the tower 2. The wind turbine rotor 4, comprising three wind turbine blades 5 mounted on a hub 6, is connected to the nacelle 3 through the low speed shaft which extends out of the nacelle 3 front.

Figure 2:
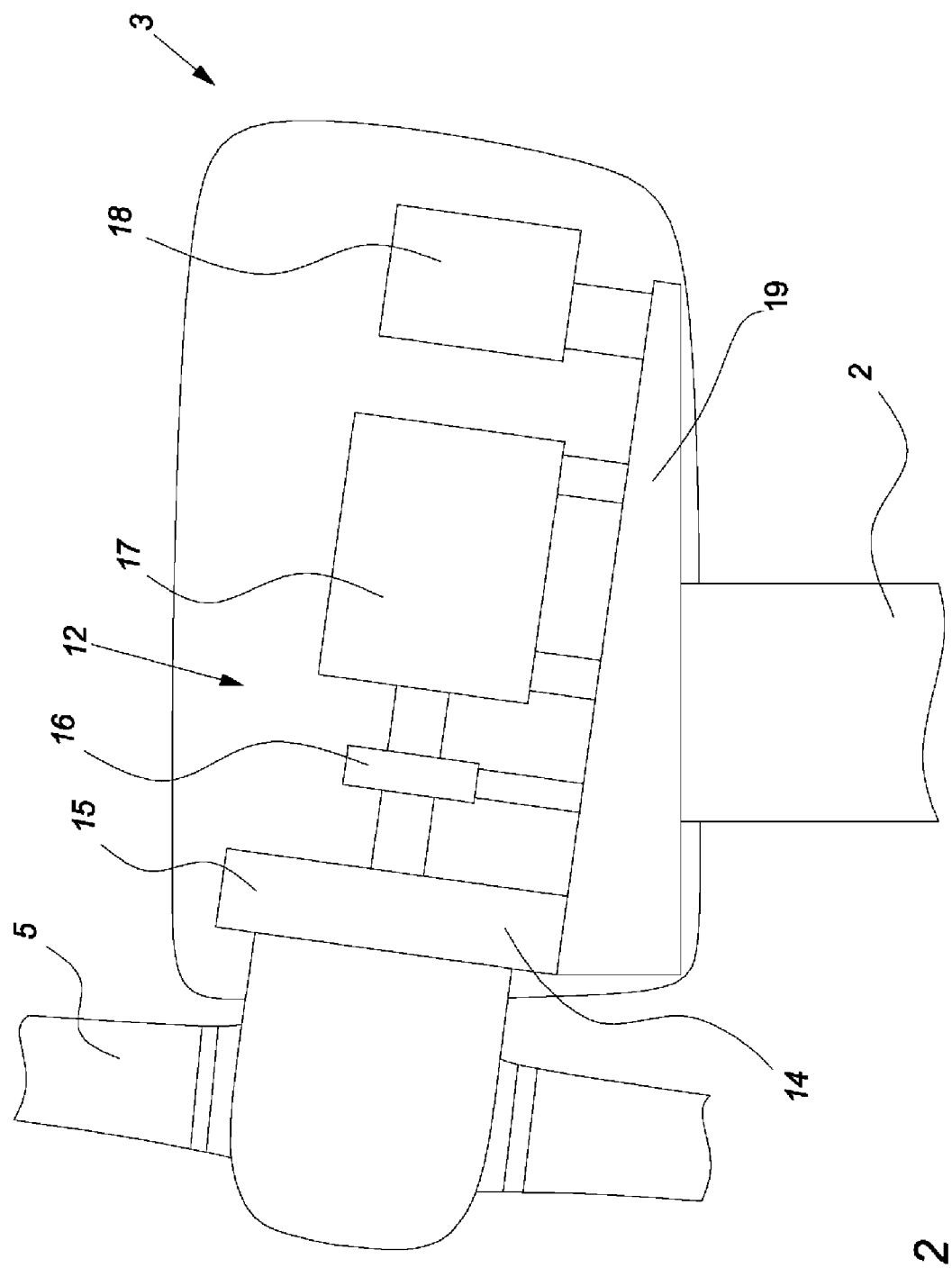
FIG. 2 illustrates a cross section of an embodiment of simplified nacelle known in the art, as seen from the side.

FIG. 2 illustrates a simplified cross section of a wind turbine nacelle 3, as seen from the side. Nacelles 3 exists in a multitude of variations and configurations but in most cases the drive train in the nacelle 3 comprise one or more of the following components: a gearbox 15 (typically a epicyclical gearbox), a coupling (not shown), some sort of breaking system 16 and a generator 17. A nacelle 3 of a modern wind turbine 1 can also include a converter 18 (also called an inverter) and additional peripheral equipment such as further power handling equipment, control cabinets, hydraulic systems, cooling systems and more.

The weight of the entire nacelle 3 including the nacelle components 15, 16, 17, 18 is carried by a strengthening structure 19. The components 15, 16, 17, 18 are usually placed on and/or connected to this common load carrying structure 19. In this simplified embodiment the load carrying structure 19 only extends along the bottom of the nacelle 3 e.g. in form of a bed frame to which some or all the components 15, 16, 17, 18 are connected. In another embodiment the load carrying structure 19 could comprise a gear bell which through the main bearing unit 14 could transfer the load of the rotor 4 to the tower 2, or the load carrying structure 19 could comprise several interconnected parts such as latticework.

The nacelle further comprise a main bearing unit for ensuring that the rotor 4 can rotate substantially freely in relation to the nacelle 3 and the fixed drive train parts 15, 16, 17, 18 of the nacelle 3. In this embodiment of a drive train the main bearing unit is integrated in the gearbox 15 in that the rotor 4 is connected directly to the gearbox 15 via the hub 6. Because the main bearing is incorporated in the gearbox 15, the gearbox structure has to be able to transfer the entire load of the rotor 4 to the tower 2 by means of the nacelle strengthening structure 19.

Figure 3:
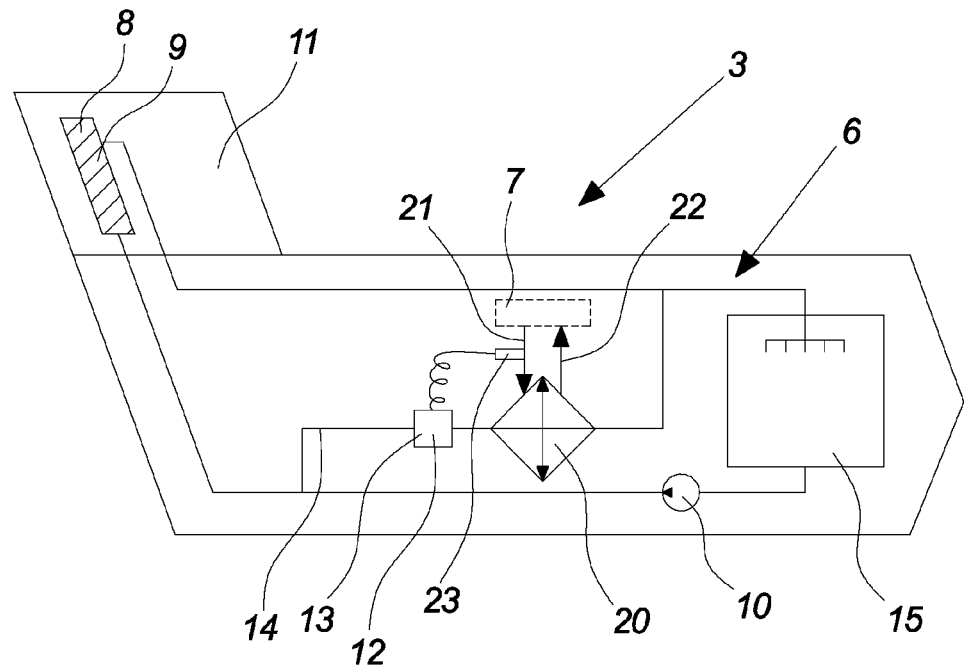
FIG. 3 illustrates an embodiment of a temperature control system in a wind turbine, as seen from the side.

FIG. 3 illustrates an embodiment of a first temperature control system 6 in the nacelle 3 of a wind turbine 1, as seen from the side.

In this embodiment of the invention the wind turbine component—that the first temperature control system 6 is connected with—is a gearbox 15 but in another embodiment the wind turbine component could be a hydraulic system where the oil flowing through the temperature control system 6 was the hydraulic oil, the component could one of the wind turbines power producing or converting components such as the generator 17, converter 18 or other components or systems where oil would be used for its electrically isolating qualities, lubricating qualities or other besides being used as a cooling medium.

In another embodiment the fluid flowing in the first temperature control system 6 could be air e.g. in a system for controlling the air temperature inside the wind turbine 1, such as inside the nacelle 3 or the air temperature inside one or more components in the wind turbine 1 such as the air temperature inside a control cupboard or other. The fluid flowing in the first temperature control system 6 could also be a liquid such as an anti-freeze and water solution, brine, methanol, propylene glycol or potassium acetate e.g. for controlling the temperature of electrical or mechanical components in or immediately outside the wind turbine 1.

In this embodiment of the invention the gearbox 15 is provided with a temperature control system 6 comprising oil circulating in the system 6 and thereby transporting heat from the gearbox 15 to a heat sink 8.

In this embodiment the heat sink 8 is a radiator 9 but in another embodiment the heat sink 8 could be an active cooler, pipes leading the fluid through the water surrounding an offshore wind turbine, pipes leading the fluid through the wind turbine foundation or the ground surrounding the foundation, a heat exchanger or any other means suitable for enabling that the heat of the fluid can be given off.

In this embodiment of the invention a pump 10 creates a flow in the oil enabling that the hot oil is transported from the gearbox 15 to the radiator 9 and back again.

In this embodiment the radiator 9 is placed in a separate compartment 11 on top of the nacelle 3 where the wind flows substantially freely through the radiator 9 making the oil give of its heat to the air surrounding the wind turbine 1. In another embodiment the radiator 9 could be placed elsewhere outside the nacelle 3 or the radiator 9 could be placed inside the nacelle 3 or inside other parts of the wind turbine 1 such as inside the tower 2, hub, blades 5 or anywhere else enabling that the radiator 9 can be cooled by a flow of air e.g. from the outside of the wind turbine 1.

Oil exists in a multitude of variations with different additives and other and in this embodiment the oil circulating in the first temperature control system 6 is mineral oil but in another embodiment the oil could be synthetic or semi-synthetic oil e.g. improved by a number of different additives.

In this embodiment of the invention the first temperature control system 6 is provided with a cross line 14 enabling that that the oil can return to the gearbox 15 without having been through the radiator 9. Passage through this "short cut" 14 is controlled by temperature controlled means 12 which in this case is a valve 13 capable of opening and closing on the basis of the temperature of the cooling medium of a further temperature control system 7.

The cross line 14 is further provided with a heat exchanger 20 enabling that the oil that flows through the cross line 14 can give off heat to the cooling medium of the further temperature control system 7.

In this embodiment the temperature—that controls the temperature controlled means 12—is measured in the inflow 21 of the heat exchanger 20 but in another embodiment the temperature could be measured in the outflow 22 of the heat exchanger 20 or anywhere else in the further temperature control system 7.

In this embodiment the valve 13 is a simple purely mechanical radiator valve 13 functioning on the same principles as a common radiator valve known from domestic ribbed heating elements where a gas expands the higher the temperature gets and thereby gradually shuts the valve 13. However it should be noted that if the valve 13 where to react on temperature changes of the fluid in the first temperature control system 6, the radiator valve 13 according to the invention would be reverse acting compared to an ordinary domestic radiator valve, in that a radiator valve 13 according to the invention would then allow less fluid to pass the valve 13 the colder fluid was.

In another embodiment the position of the valve 13 could be electrically controlled e.g. by means of a motor opening and shutting the passage through valve 13 on the basis of a electrical signal from a digital thermometer 23.

In this embodiment the operating range or the valve 13 is −70° C. to +100° C., preferably −40° C. to +50° C. and most preferred −10° C. to +30° C. i.e. the valve 13 is completely open at −10° C. and completely closed at +30° C.

In another embodiment this operating range could be different e.g. depending on the capacity of the temperature control systems 6, 7, the heat produced, the ambient temperature, the site or other.

In this embodiment the relation between the temperature and the position of the valve 13 (how open/closed the valve 13 is) is substantially directly proportional within the operating range but in another embodiment this relation could be exponential or it could be defined by a predefined curve, the valve 13 could open and/or close in steps, the valve could be a simple on-off valve or other.

Figure 4:
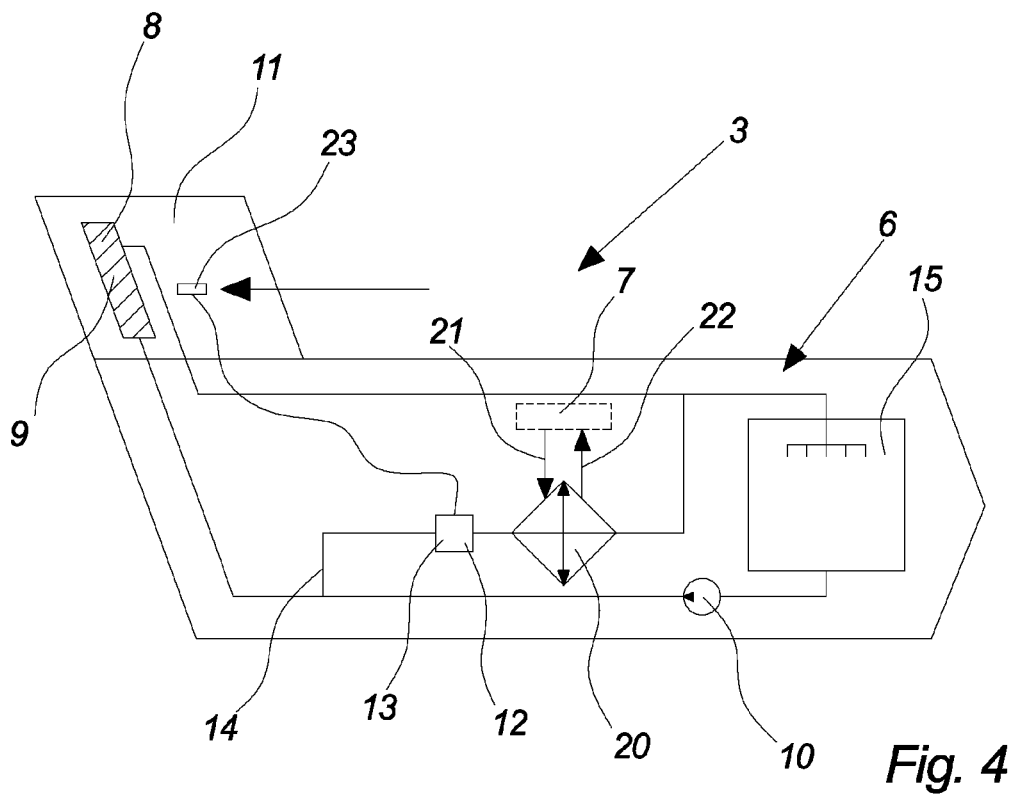
FIG. 4 illustrates another embodiment of a temperature control system in a wind turbine, as seen from the side.

FIG. 4 illustrates another embodiment of a first temperature control system 6 in a wind turbine 1, as seen from the side.

In this embodiment of the invention the temperature controlled means 12 is controlled on the basis of temperature measurements of the outside air flowing into the heat sink 8 of the first temperature control system 6.

In another embodiment the temperature or some sort of corresponding signal could be provided by the temperature sensor in the wind turbine 1 used for detecting the general ambient temperature. If the wind turbine 1 was part of a wind turbine park the signal could be provided by other wind turbines, by central temperature measuring means, by the SCADA (Supervisory Control And Data Acquisition) system, by a national or regional Weather Service e.g. online or otherwise.

In a further embodiment the temperature controlled means 12 could also react as a direct response to the temperature of the oil in the first temperature control system 6.

As previously mentioned it should be emphasized that the temperature, which controls the temperature controlled means 12 is not necessary directly measured and then fed to the temperature controlled means 12, which then would comprise means for reacting in accordance with the measurement.

The temperature controlled means 12 could also react directly on temperature changes e.g. if the temperature controlled means 12 comprised a gas, a spring or other, expanding and contracting as a direct consequence of the temperature due to thermal expansion.

Figure 5:
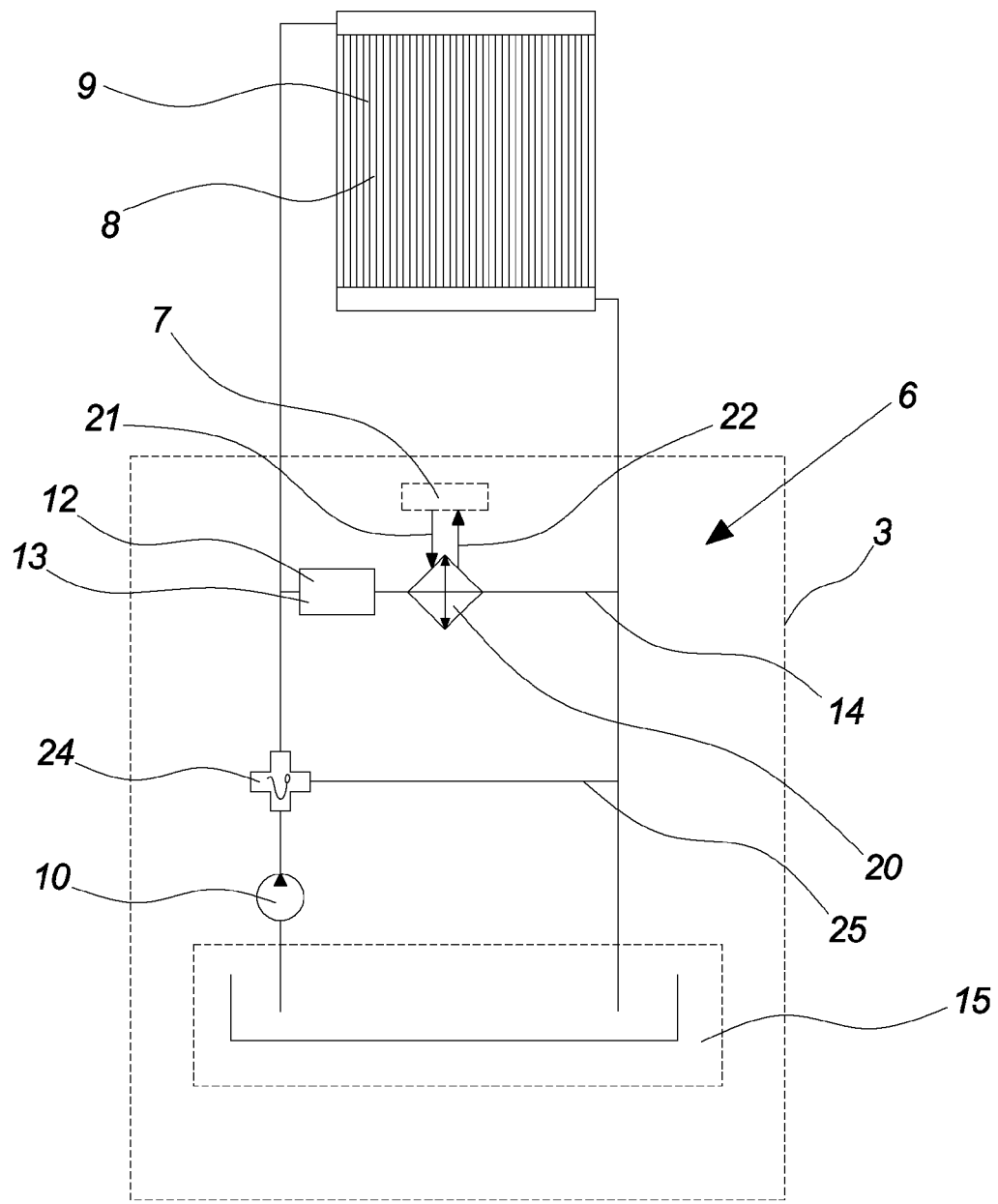
FIG. 5 illustrates a diagram of a first embodiment of a temperature control system in a wind turbine.

FIG. 5 illustrates a diagram of a first embodiment of a first temperature control system 6 in a wind turbine 1.

In this embodiment of the invention the first temperature control system 6 is a system for controlling the temperature of oil circulating in a lubrication- and cooling system of a wind turbine gearbox 15.

The method is that when the cold wind turbine 1 is starting up e.g. on a cold winter day, the fluid (which in this case is the gearbox oil) in the first temperature control system 6 is cold and relatively high viscous. When or before the parts of the gearbox 15 starts to move the pump 10 is activated and start to create a flow of oil in the first temperature control system 6.

In this embodiment the first temperature control system 6 is provided with a 3-way thermostatic valve 24 directing the oil through a second cross line 25 and back into the oil sump of the gearbox 15 as long as the oil temperature is below a certain level.

When the gearbox 15 has warmed up and the oil temperature has reached a level where cooling is needed the 3-way thermostatic valve 24 shuts the second cross line 25 and directs the flow of the oil towards the heat sink 8 where the fluid in the first temperature control system 6 heat exchanges with the air outside the nacelle 3.

The airflow through the radiator 9 could be controlled by a radiator fan (not shown) which e.g. would increase or reduce the airflow through the radiator on the basis of temperature measurements of the air, the oil before or after the radiator 9, at fixed time intervals or other.

But at low ambient temperatures there is a risk of the oil becoming so cold and thick that the pressure of the oil on the input side of radiator 9 rises to a unwanted level and the flow through the radiator 9 becomes so little that the gearbox 15 can not be cooled efficiently even though it is very cold outside the wind turbine 1. In worst case the oil more or less solidifies in the radiator and thereby clogs it.

This problem is solved by directing the hot oil through a first cross line 14 where the oil is lead through some sort of heat exchanger 20 in which the oil can give off its heat to the fluid in a further temperature control system 7 of the wind turbine 1.

This further temperature control system 7 could be a system for controlling the temperature of a cooling fluid flowing through e.g. the wind turbine generator 17, the converter 18 and/or through one or more other wind turbine components or it could be a system for controlling the air temperature inside the wind turbine 1, such as inside the nacelle 3 or the air temperature inside one or more components in the wind turbine 1 such as the air temperature inside a control cupboard or other.

However it should be emphasised that the further temperature control system 7 in a specific wind turbine 1 cannot be the same as the first temperature control system 6, in that it cannot be the same fluid controlling the temperature of the same component for substantially the same purpose. If the heat exchange between the systems 6, 7 shall be effective, the systems 6, 7 have to be separate and the further temperature control system 7 has to have a over-capacity enabling it to remove the heat from the first temperature control system 7 as well as the heat produced by the component, area or other to which the further temperature control system 7 is connected.

A temperature control system 7 for controlling the temperature of e.g. the generator 17 or converter 18 would be dimensioned to work efficiently even if the ambient temperature was above 30° Celsius and such systems would therefore have a large over-capacity at ambient temperatures e.g. below 0° Celsius. This over-capacity can therefore be utilized by the first temperature control system 6 when the ambient temperature is low. When the ambient temperature raises again the over-capacity of the further temperature control system 7 will be reduced but then the first temperature control system 7 will no longer need to heat interact with the further temperature control system 7.

The fluid flowing in the further temperature control system 7 could therefore be a liquid such as an anti-freeze and water solution, brine, methanol, propylene glycol or potassium acetate, a gas such as air, hydrocarbon, isobutene, Chlorofluorocarbons (CFC) gas or other types of gas depending of the type of temperature control system. The fluid in the further temperature control system 7 could also be oil.

Figure 6:
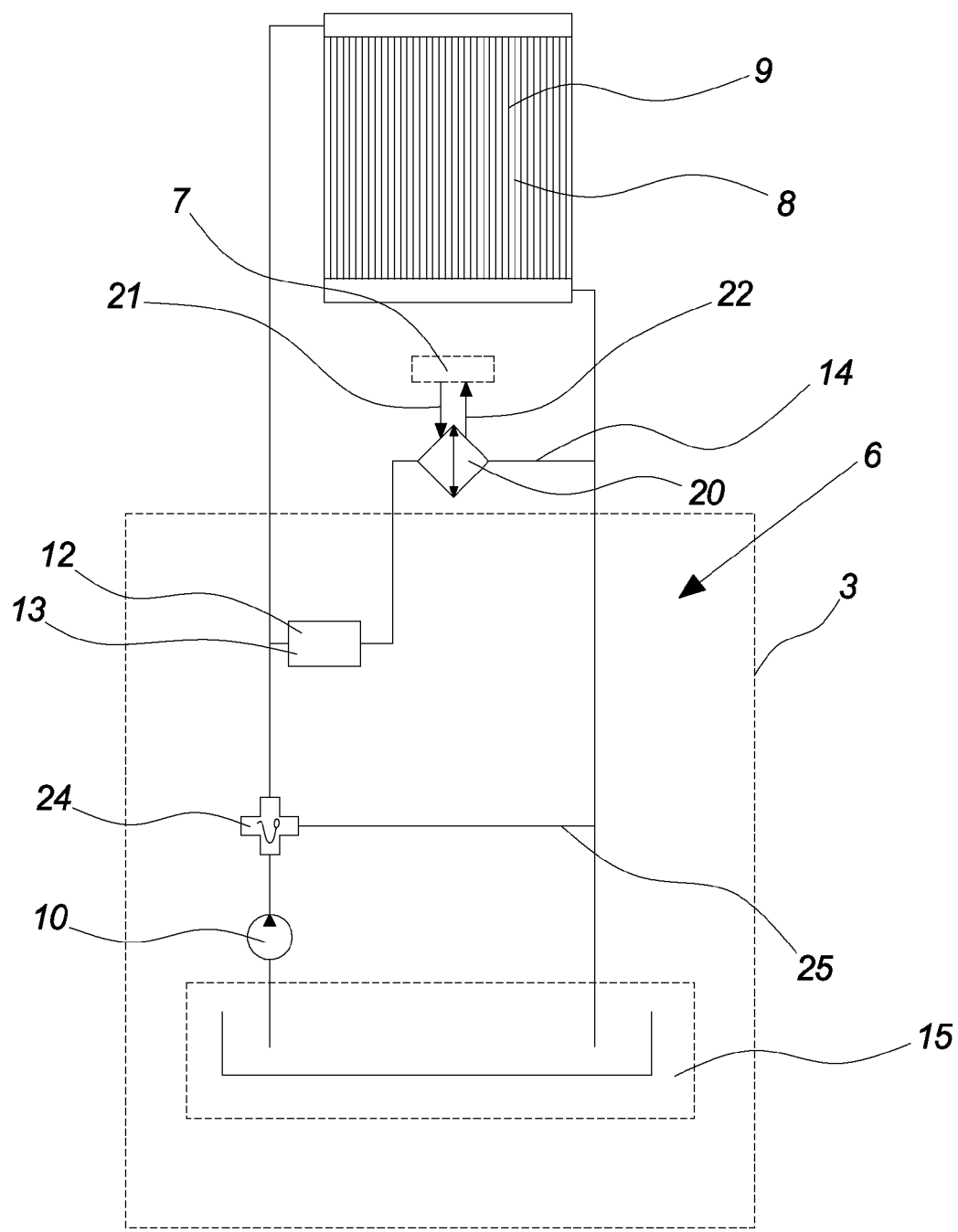
FIG. 6 illustrates a diagram of a second embodiment of a temperature control system in a wind turbine.

FIG. 6 illustrates a diagram of a second embodiment of a temperature control system 6 in a wind turbine 1.

In the embodiment illustrated in FIG. 5 both the temperature controlled means 12 and the heat exchanger 20 is placed inside the wind turbine nacelle 3 but in this embodiment of the invention the heat exchanger 20 is placed outside the nacelle 3 e.g. in the tower 2 or in a neighboring shed comprising power handling equipment of the wind turbine 1.

Likewise the further temperature control system 7 could entirely or partly be placed outside the nacelle 3.

Figure 7:
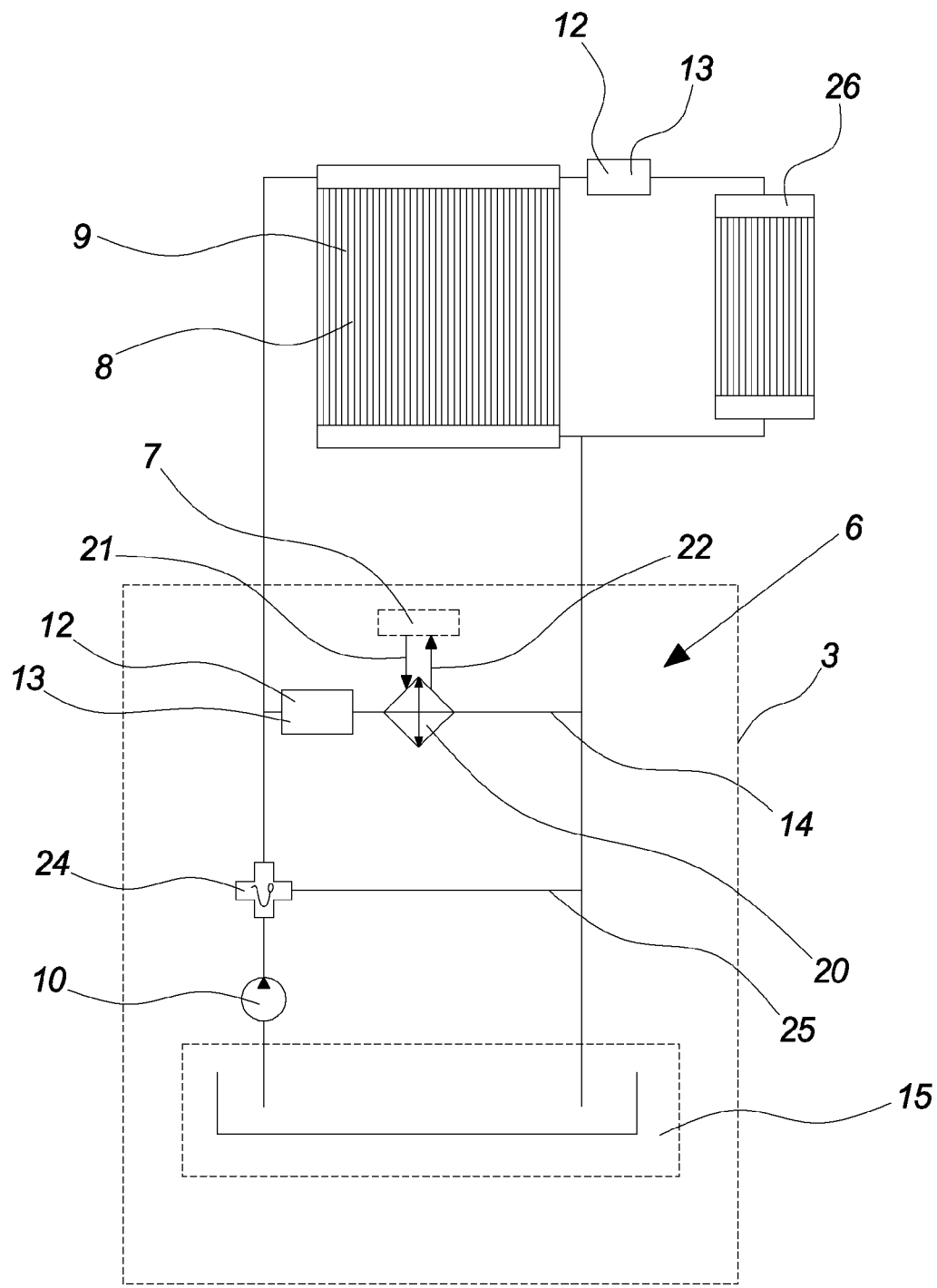
FIG. 7 illustrates a diagram of a third embodiment of a temperature control system in a wind turbine.

FIG. 7 illustrates a diagram of a third embodiment of a temperature control system 6 in a wind turbine 1.

In this embodiment the first temperature control system 6 further comprise an additional heat sink 26 in the form of an additional radiator 26 with a smaller capacity that the traditional radiator 9. When the temperature drops beneath a predefined level a further temperature controlled valve 13 redirects the fluid around the traditional radiator 8 and through the additional radiator 26 with the smaller capacity, hereby reducing the risk of the fluid being cooled too much.

Figure 8:
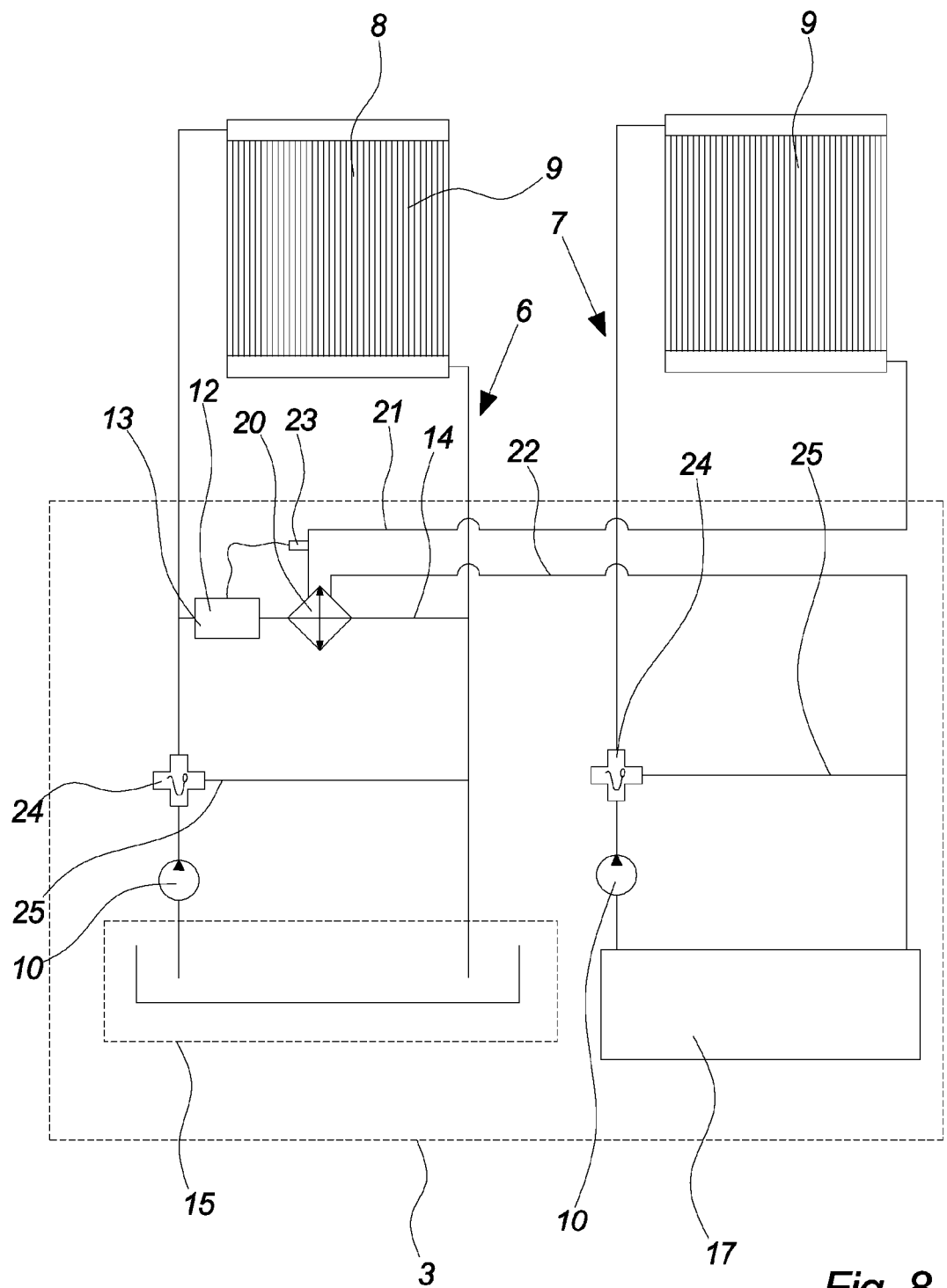
FIG. 8 illustrates a diagram of two temperature control systems in a wind turbine.

FIG. 8 illustrates a diagram of two temperature control systems 6, 7 in a wind turbine 1.

In this embodiment the further temperature control systems 7 is the system controlling the temperature of the wind turbine generator 17.

Like the first temperature control system 6 the further temperature control system 7 comprise a pump 10 enabling a flow of the cooling fluid circulating in the further temperature control system 7. The further temperature control system 7 also comprises a 3-way thermostatic valve 24 and a second cross line primarily for use during start up.

In this embodiment the return-fluid coming from the radiator 9 of the further temperature control system 7 is through the inflow 21 directed through the heat exchanger 20 and back into the generator 17 through the outflow 22.

In this embodiment temperature sensing means 23 of the temperature controlled means 12 is constantly detecting the temperature of the inflow fluid of the further temperature control system 7 and if this temperature drops below a certain level the temperature controlled means 12 opens for passage of fluid from the first temperature control system 6 through the heat exchanger 20.

Figure 9:
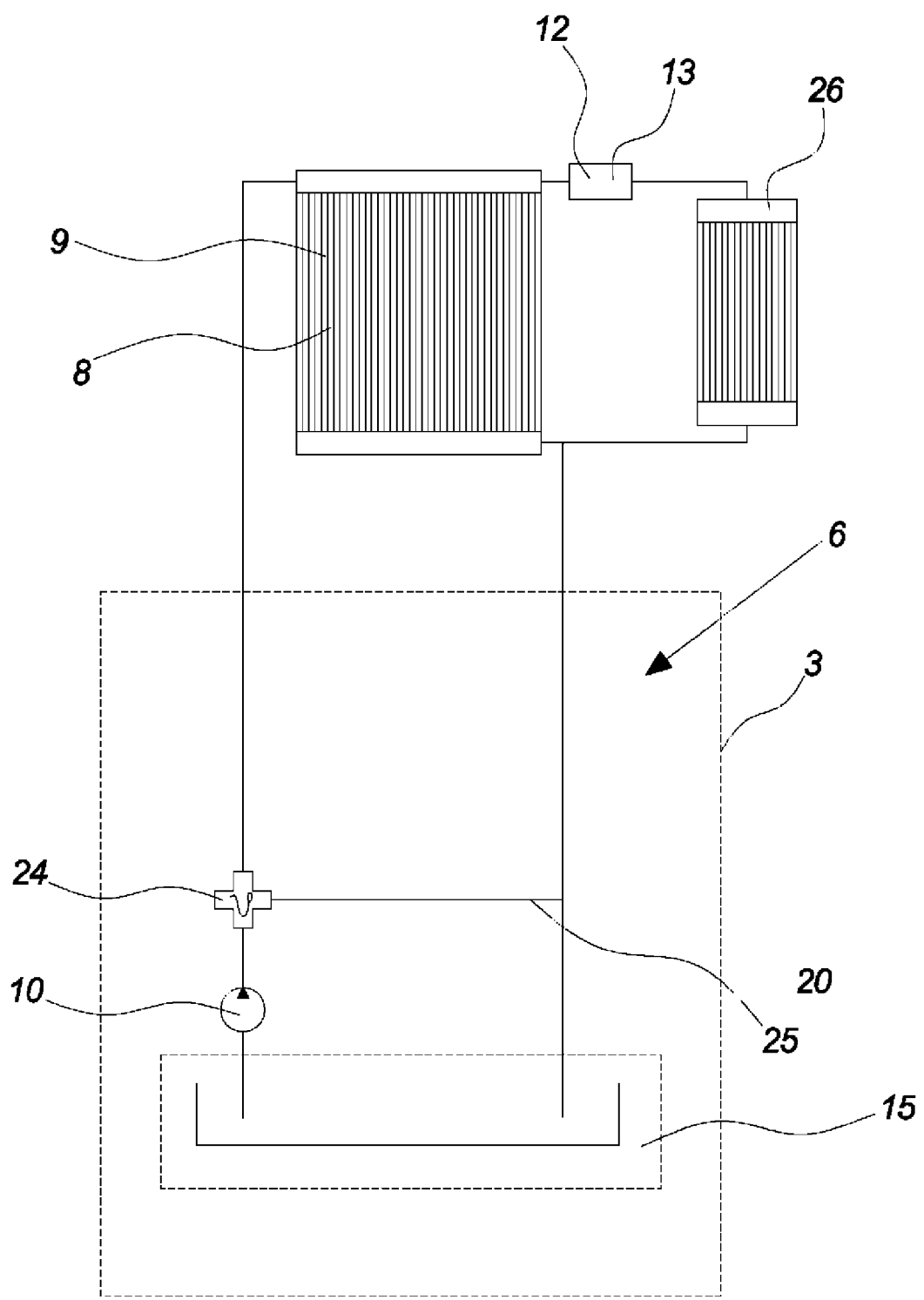
FIG. 9 illustrates a diagram of a fourth embodiment of a temperature control system in a wind turbine.

FIG. 9 illustrates a diagram of a fourth embodiment of a temperature control system 6 in a wind turbine 1.

This embodiment of a temperature control system 6 resembles the system 6 described in FIG. 7 in that the first temperature control system 6 further comprise an additional heat sink 26 with a smaller capacity that the traditional radiator 9. In this embodiment the additional heat sink 26 is an additional radiator 26.

However in this embodiment the temperature control system 6 does not comprise a first cross line 14 or any of the components disposed on this line 14, in that in this embodiment the temperature control system 6 is provided with a temperature controlled valve 13 which can redirects the fluid around the traditional radiator 9 and through the additional radiator 26 with a smaller capacity. This redirection would be enabled by the temperature controlled valve 13 when the temperature drops beneath a predefined level, it could happen in response to a pressure measurement in the temperature control system 6 or the passage through the temperature controlled valve 13 could be controlled continuously in accordance with the temperature of the fluid or the surrounding.

The invention has been exemplified above with reference to specific examples of designs and embodiments of wind turbines 1, temperature controlled means 12, temperature control systems 6, 7 and other. However, it should be understood that the invention is not limited to the particular examples described above but may be designed and altered in a multitude of varieties within the scope of the invention as specified in the claims.

What is claimed is:

1. A wind turbine temperature control system, comprising:
a wind turbine tower;
a wind turbine nacelle positioned at an upper portion of the wind turbine tower;
a wind turbine rotor including two or more wind turbine blades mounted to a central hub and rotatably supported from within the nacelle;
a drivetrain that receives mechanical energy from the wind turbine rotor and converts the mechanical energy into electrical energy;
at least one heat generating component of the wind turbine housed within the wind turbine nacelle;
a heat exchanger positioned outside of the wind turbine nacelle;
a heat exchange fluid pathway including a first portion leading from the at least one heat generating component to the heat exchanger and a second portion leading from the heat exchanger to the heat generating component of the wind turbine;
a bypass heat exchange fluid pathway that connects the first portion of the heat exchange fluid pathway to the second portion of the heat exchange fluid pathway, bypassing the heat exchanger;
a bypass valve that controls fluid communication between the first portion of the heat exchange fluid pathway and the bypass heat exchange fluid pathway; and
a heat exchange fluid in the heat exchanger, the heat exchange fluid pathway and the bypass heat exchange fluid pathway.

2. The wind turbine temperature control system of claim 1, further comprising a controller that prevents flow to the heat exchanger when a fluid temperature is below a lower threshold temperature level.

3. The wind turbine temperature control system of claim 2, wherein the lower threshold temperature level is thirty degrees centigrade.

4. The wind turbine temperature control system of claim 2, wherein the lower threshold temperature level is forty degrees centigrade.

5. The wind turbine temperature control system of claim 2, wherein the controller prevents flow through the bypass heat exchange fluid pathway when a fluid temperature is above an upper threshold temperature level.

6. The wind turbine temperature control system of claim 5, wherein the upper threshold temperature level is forty degrees centigrade.

7. The wind turbine temperature control system of claim 5, wherein the upper threshold temperature level is fifty degrees centigrade.

8. The wind turbine temperature control system of claim 1, wherein the heat exchange fluid includes oil.

9. The wind turbine temperature control system of claim 1, wherein the heat exchange fluid includes anti-freeze.

10. The wind turbine temperature control system of claim 1, wherein the heat generating component includes at least one of a gearbox, a converter, and a generator.

11. The wind turbine temperature control system of claim 1, wherein the heat exchanger includes a radiator.

12. The wind turbine temperature control system of claim 11, wherein the radiator includes a fan to move air therethrough.

13. The wind turbine temperature control system of claim 1, wherein the heat exchanger includes a sea water cooler.

14. The wind turbine temperature control system of claim 1, wherein the heat exchanger includes a first heat exchanger portion and a second heat exchanger portion.

15. The wind turbine temperature control system of claim 14, further comprising a valve that controls the flow of fluid to the second heat exchanger portion.

16. A method of controlling temperature in a heat generating component of a wind turbine, the method comprising:
harvesting mechanical energy from wind energy with a rotatable rotor of the wind turbine;
converting the mechanical energy into electrical energy with a drivetrain of the wind turbine, at least one component of the drivetrain being a heat generating component;
receiving heat from the heat generating component of the drivetrain in a heat exchange fluid; and
preventing the heat exchange fluid from flowing to a heat exchanger from the heat generating component of the drivetrain by passing at least a portion of the heat exchange fluid through a bypass heat exchange fluid pathway until a threshold temperature is reached.

17. The method of claim 16, wherein the heat generating component is a gearbox.

18. The method of claim 16, wherein the threshold temperature is thirty degrees centigrade.

19. The method of claim 16, wherein the threshold temperature is forty degrees centigrade.

* * * * *